United States Patent
Chou

(10) Patent No.: US 6,201,572 B1
(45) Date of Patent: Mar. 13, 2001

(54) ANALOG CURRENT MODE ASSISTED DIFFERENTIAL TO SINGLE-ENDED READ-OUT CHANNEL OPERABLE WITH AN ACTIVE PIXEL SENSOR

(75) Inventor: Eric Y. Chou, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/018,022

(22) Filed: Feb. 2, 1998

(51) Int. Cl.[7] .............................. H04N 5/217; H04N 3/14
(52) U.S. Cl. ......................... 348/241; 348/308; 348/312; 257/292; 250/208.1
(58) Field of Search ..................... 250/208.1; 257/239, 257/291, 292, 294, 443; 348/241, 250, 294, 300, 301, 302, 307–311, 315; H04N 5/217, 3/14, 9/64

(56) References Cited

U.S. PATENT DOCUMENTS

| | | | |
|---|---|---|---|
| 5,434,619 | * | 7/1995 | Yonemoto ............................. 348/308 |
| 5,471,515 | * | 11/1995 | Fossum ................................ 257/292 |
| 5,631,704 | * | 5/1997 | Dickinson ............................. 348/308 |
| 5,841,126 | * | 11/1998 | Fossum ................................ 348/308 |
| 5,898,168 | * | 4/1999 | Gowda ................................ 250/208.1 |
| 5,900,623 | * | 5/1999 | Tsang ................................. 250/208.1 |

OTHER PUBLICATIONS

R. H. Nixon, S. E. Kemeny, C. O. Staller, & E. R. Fossum; Center for Space Microelectronics Technology, Jet Propulsion Laboratory–California Institute of Technology, 4800 Oak Grove Drive, Pasadena, CA 91109; 128×128 CMOS Photodiode–Type Active Pixel Sensor with On–Chip Timing, Control and Signal Chain Electronics; SPIE vol. 2415/117 to SPIE vol. 2415/123.

* cited by examiner

*Primary Examiner*—Wendy Garber
*Assistant Examiner*—Ngoc-Yen Vu
(74) *Attorney, Agent, or Firm*—Brian R. Short

(57) ABSTRACT

The present invention provides an active pixel sensor read-out channel that includes an active pixel. The active pixel drives an active pixel output to a signal voltage having an amplitude proportional to an intensity of light received by the active pixel. The active pixel drives the active pixel output to a reference voltage when the active pixel is not exposed to light. The active pixel output is connected to a sample and hold circuit. The sample and hold circuit samples and stores the signal voltage and samples and stores the reference voltage. A buffer amplifier generates a difference voltage between the sampled and stored signal voltage and the sampled and stored reference voltage.

10 Claims, 4 Drawing Sheets

ANALOG CURRENT MODE ASSISTED DIFFERENTIAL TO SINGLE-ENDED READ-OUT CHANNEL OPERABLE WITH AN ACTIVE PIXEL SENSOR

FIELD OF INVENTION

This invention relates generally to an analog active pixel sensor read-out channel. In particular, it relates to a current mode gain assisted differential to single-ended analog read-out channel for an active pixel sensor.

BACKGROUND

An electronic camera generally converts an optical image into a set of electronic signals. The electronic signals may represent intensities of colors of light received by the camera. The electronic camera typically includes an array of image sensors or light sensitive sensors which detect the intensity of light received by the camera. The image sensors typically generate electronic signals that have amplitudes that are proportionate to the intensity of the light received by the sensors. The electronic signals can be conditioned and sampled to allow image processing.

Integration of the image sensors with signal processing circuitry is becoming more important because integration enables miniaturization and improvement of imaging systems. Integration of image sensors along with analog and digital signal processing circuitry allows electronic camera systems to be low cost, compact and require low power.

Historically, image sensors have predominantly been charged coupled devices (CCDs). CCDs are relatively small and can provide a high-fill factor. However, CCDs are very difficult to integrate with digital and analog circuitry. Further, CCDs dissipate a large amount of power and suffer from image smearing problems.

Historically, CCDs have been the light sensitive pixel cells typically used in solid state visible light imaging device applications. However, CMOS active pixel sensors which include photo-gate or photo-diode structures with signal amplification circuits within a light sensitive pixel cell, offer several advantages over CCDs. CMOS active pixel sensors dissipate less power, can be manufactured less expensively, require lower power supply voltages and are easier to integrate into large scale integrated circuits than CCDs. Additionally, CMOS active pixel sensors can be manufactured in low cost, high volume application specific integrated circuits (ASICs) CMOS processes. Therefore, ASIC manufacturers can develop light sensitive pixel cells. ASIC manufacturers can further reduce manufacturing costs and provide additional performance benefits as CMOS technology advances.

FIG. 1 shows a prior art light sensitive pixel cell 2 and a corresponding read-out channel 4. The read-out channel 4 includes a light image signal output VS and a reference output VR.

The pixel cell 2 generates an output signal having an amplitude which is proportionate to the intensity of light being received by the pixel cell 2. The output signal, however, also includes a fixed pattern of noise. The fixed pattern of noise reduces the correspondence between the intensity of light received by the pixel cell and the resulting amplitude of the output signal. Further, the fixed pattern of noise varies between different pixel cells because of process, temperature and biasing variations.

The pixel cell 2 includes a photo-diode D1, a reset transistor Q1 and output transistors Q2, Q3. The fixed pattern noise of the pixel cell 2 generally consists of dark current noise and shot noise of the photo-diode D1, reset and clock noise of the reset transistor Q1, and gain variation of the output transistor Q2. As was previously mentioned, the fixed pattern of noise varies between different pixel cells because of process, temperature and differences in biasing conditions between pixel cells.

An electronic image is captured by sampling the charge accumulated by each of the light sensitive pixel cells of an array of light sensitive pixel cells. The amount of charge accumulated by each light sensitive pixel cell is proportional to the intensity of the light received by the light sensitive portion of the light sensitive pixel cell. The fixed patten noise of the light sensitive pixel cells reduces the correlation between the sampled value of the charge conducted by the light sensitive pixel cells and the intensity of the light received by the light sensitive pixel cells.

A reference response for the fixed pattern noise of the pixel cell 2 can be determined by sampling the response of pixel cell 2 while the pixel cell 2 is not exposed to any light. Errors in a captured electronic image due to the fixed pattern noise of an array of pixel cells 2 can be eliminated by subtracting the reference response from the captured image. This process, called correlated double sampling, is accomplished by the prior art light sensitive pixel cell 2 and the corresponding read-out channel 4 by sampling the light image signal output VS generating a signal response, and sampling the reference output VR generating a reference response. Therefore, two samples are required for each pixel cell 2 of an array of pixel cells to eliminate the fixed pattern noise effects within a sampled electronic image. For large arrays, a large number of electronic samples are required to construct an image.

The read-out channel 4 includes signal amplification circuitry 6 and reference amplification circuitry 8. Both the signal amplification circuitry 6 and the reference amplification circuitry 8 include offset errors. The offset errors reduce the correspondence between the pixel cell 2 response and the sampled electronic image. The offset errors can be estimated by driving the inputs to the signal amplification circuitry and the reference amplification circuitry to a predetermined voltage potential and sampling the voltage potential of the signal output VS and a reference output VR generating sampled offset voltages. The offset errors can be eliminated from a captured image by subtracting the sampled offset voltages from the signal response and the reference response. However, this requires four samples for each pixel within an array of pixels to capture an electronic response.

Each pixel cell 2 within an array of pixel cells includes a read-out channel 4 having a light image signal output VS and a reference output VR. The signal output VS and a reference output VR of many read-out channels are connected to a conductive line typically called a "bitline." Generally, many outputs will be connected to a single bitline. The bitlines capacitively load the signal output VS and the reference output VR. The capacitive loading increases the settling time required for the signal output VS and the reference output VR to drive the bitlines to a voltage potential which represents the signal voltage or the reference voltage of the pixel cell 2. The settling time is also dependent on the current driving ability of the read-out channel. The read-out channel 4 shown in FIG. 1 offers limited current drive. Therefore, sampling the output of the prior art read-out channel 4 can require excessive settling time as capacitance associated with a bitline is charged.

The read-out channel 4 shown in FIG. 1 provides a gain factor between the pixel cell 2 output signal and the signal output VS of between about .5 to .9. Therefore, the output signal of the pixel cell 2 is greatly attenuated before being sampled at the output of the read-out channel 4. The attenuation reduces the signal to noise ratio of pixel cell 2 output signal.

It is desirable to have an active pixel sensor read-out channel which eliminates the fixed pattern noise associated with an electronically sampled image created by sampling the response of an array of CMOS pixel cells. Ideally, the active pixel sensor read-out channel would minimize the number of samples required to capture the electronically sampled image. Further, the active pixel sensor read-out channel would be operable with an array of light pixel cell fabricated using standard CMOS processes. It is desirable to have the active pixel sensor read-out channel provide greater current drive than present read-out channels to improve the settling time of a channel output connected to a capacitive bitline. It is further desirable to have the gain factor of the active pixel sensor be greater than one.

SUMMARY OF THE INVENTION

The present invention provides an active pixel sensor read-out channel which is compatible with low-cost CMOS fabrication processes. The active pixel sensor read-out channel provides a single differential output, enhanced dynamic range, improved current gain, improved current drive and reduced capacitive loading of an interconnection bus connected to the active pixel sensor read-out channel. The single differential output reduces the number of samples required for an array of active pixel sensor read-out channels to be used to construct an electronic image. The improved current drive reduces the settling time of voltage potentials generated at the output of the active pixel sensor read-out channel.

A first embodiment of this invention includes an active pixel sensor read-out channel. The active pixel sensor read-out channel includes an active pixel. The active pixel drives an active pixel output to a signal voltage having an amplitude proportional to an intensity of light received by the active pixel. The active pixel drives the active pixel output to a reference voltage when the active pixel is not receiving light. The active pixel sensor read-out channel further includes a sample and hold circuit for receiving the active pixel output. The sample and hold circuit samples and stores the signal voltage and samples and stores the reference voltage. The active pixel sensor read-out channel further includes a buffer amplifier which generates a difference voltage between the sampled and stored signal voltage and the sampled and stored reference voltage.

A second embodiment of the invention is similar to the first embodiment. The buffer amplifier of the second embodiment includes a differential to single end amplifier stage which receives the sampled and stored signal voltage and the sampled and stored reference voltage. The differential to single end amplifier stage generates a single output voltage which includes a voltage potential proportional to the difference between the sampled and stored signal voltage and the sampled and stored reference voltage. The buffer amplifier further includes a buffer stage which receives the single output voltage and generates a buffer current having an amplitude which is proportional to the voltage potential of the single output voltage. The buffer amplifier further includes a gain stage which receives the buffer current and generates the difference voltage and an output current having an amplitude which is presetably greater than the amplitude of the buffer current.

A third embodiment of the invention is similar to the first embodiment. The sample and hold circuit of the third embodiment includes a signal storage element and a signal voltage switch for connecting the active pixel output to the signal storage element to allow the signal storage element to store the signal voltage. The sample and hold circuit further includes a reference storage element and a reference voltage switch for connecting the active pixel output to the reference storage element to allow the reference storage element to store the reference voltage.

A fourth embodiment of the invention is similar to the third embodiment. The fourth embodiment include circuitry for discharging the signal storage element and the reference storage element.

Other aspects and advantages of the present invention will become apparent from the following detailed description, taken in conjunction with the accompanying drawings, illustrating by way of example the principles of the invention.

DETAILED DESCRIPTION

Figure 1:
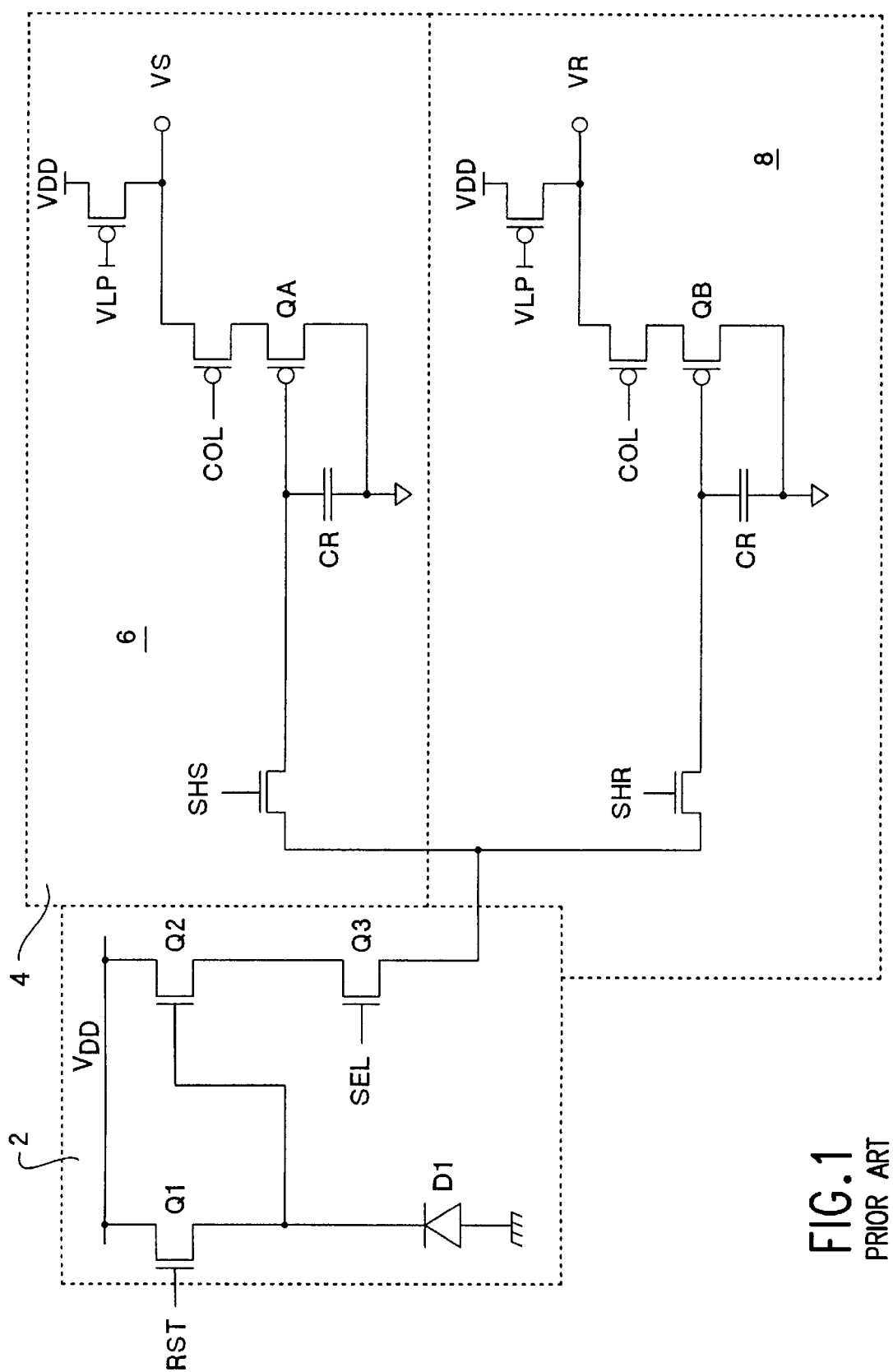
FIG. 1 shows a prior art active pixel sensor buffer amplifier.

As shown in the drawings for purposes of illustration, the invention is embodied in an active pixel sensor read-out channel. The active pixel sensor read-out channel provides a single differential output, enhanced dynamic range, improved current gain, improved current drive and reduced capacitive loading of an interconnection bus connected to the active pixel sensor read-out channel. The single differential output reduces the number of samples required for an array of active pixel sensor read-out channels to be used to construct an electronic image. The improved current drive reduces the settling time of voltage potentials generated at the output of the active pixel sensor read-out channel.

Figure 2:
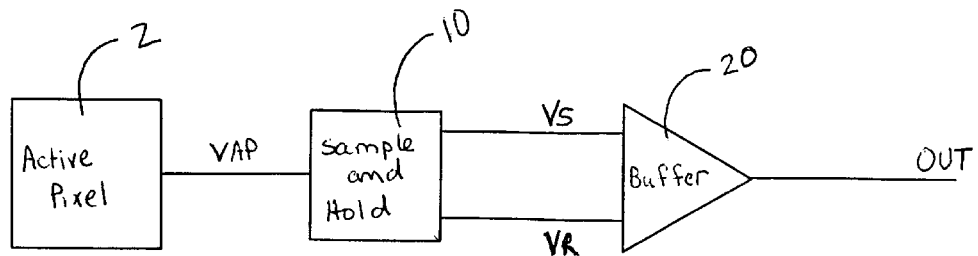
FIG. 2 shows an embodiment of the invention.

FIG. 2 shows a first embodiment of the invention which includes an active pixel sensor read-out channel. The active pixel sensor read-out channel includes an active pixel 2, a sample and hold circuit 10 and a buffer amplifier 20. The active pixel 2 generates a voltage (VAP) at an active pixel output which has an amplitude proportional to the intensity of light received by the active pixel 2. The sample and hold circuit 10 is connected to the active pixel 2 output. The sample and hold circuit 10 samples and stores a signal voltage having an amplitude proportional to an intensity of light received by the active pixel 2. Additionally, the sample and hold circuit 10 samples and stores a reference voltage having an amplitude proportional to a fixed noise pattern generated by the active pixel 2. The buffer amplifier 20 generates a difference voltage between the sampled and stored signal voltage and the sampled and stored reference voltage. The difference voltage of the buffer amplifier is a single output voltage in which the fixed noise pattern of the active pixel 2 is internally subtracted from the signal voltage of the active pixel 2. Unlike the prior art, the fixed noise pattern is subtracted from the signal voltage before the active pixel output voltage is sampled. Therefore, the invention requires half the number of samples to generated an electronic image than the prior art.

FIG. 2 shows a single active pixel 2. However, typically many active pixels 2 are assembled in an array for the purpose of electronically sampling a light image which is sensed by the array.

Figure 3:
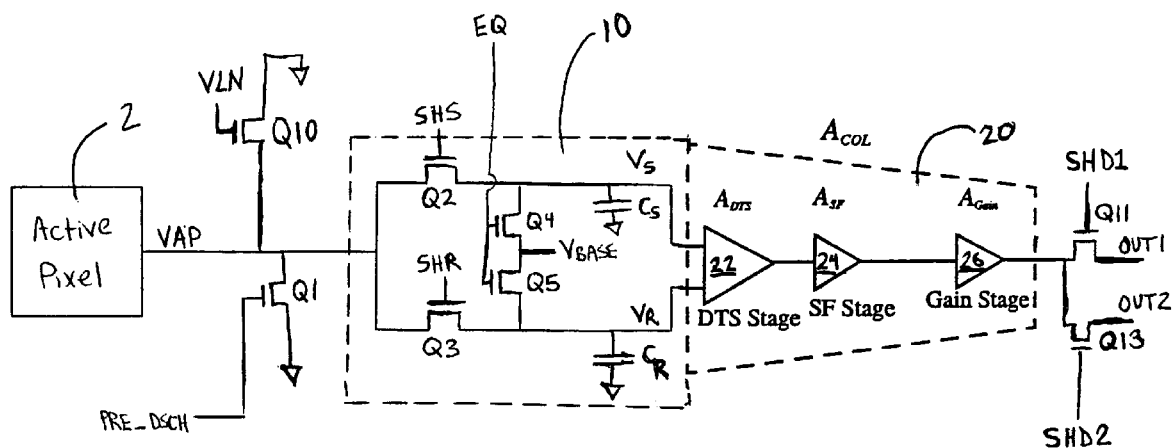
FIG. 3 shows another embodiment of the invention.

FIG. 3 shows another embodiment of the invention. This embodiment includes greater detail of the sample and hold circuit 10. The sample and hold circuit 10 includes a signal capacitor CS, a reference capacitor CR, a signal switch transistor Q2, a reference switch transistor Q3 and a pair of equalizer transistors Q4, Q5.

The signal switch transistor Q2 is turned on when the active pixel 2 is being exposed to light. The signal voltage generated by the active pixel 2 when the active pixel is exposed to light is stored on the signal capacitor CS. The reference switch transistor Q3 is turned on when the active pixel 2 is not exposed to light. The reference signal generated by the active pixel 2 when the active pixel 2 is not exposed to light is stored on the reference capacitor CR. A signal voltage VS stored on the signal capacitor CS is a first input to the buffer amplifier 20. A reference voltage VR stored on the reference capacitor CR is a second input to the buffer amplifier 20.

The buffer amplifier 20 generates a difference voltage proportional to the difference between the voltage potential of the signal voltage VS and the voltage potential of the reference voltage VR. The buffer amplifier 20, however, suffers from an internal offset voltage which sums into the output of the buffer amplifier 20. The offset voltage can be determined by driving the first input and the second input of the buffer amplifier to a predetermined voltage and sampling a corresponding buffer offset voltage. The first input and the second input are driven to a predetermined voltage by charging the signal capacitor CS and the reference capacitor CR to a common voltage. The EQ control line turns on the equalizer transistors Q4, Q5 which charges the signal capacitor CS and the reference capacitor CR to a voltage potential VBASE. The buffer offset voltage is sampled when the signal capacitor CS and the reference capacitor CR are charged to a common voltage potential of VBASE. The buffer offset voltage sample is subtracted from a subsequent signal sample to eliminate the offset voltage errors associated with the buffer amplifier 20.

Output transistors Q11, Q13 provide two separate active pixel sensor read-out channel outputs OUT1, OUT2. A voltage potential on a first control line SHD1 is positively pulsed to turn on the first output transistor Q11 which connects the difference voltage of the buffer amplifier 20 to the first output OUT1. The first control line is positively pulsed when the difference voltage of the buffer amplifier 20 is to be sampled. A voltage potential on a second control line SHD2 is positively pulsed to turn on the second output transistor Q13 which connects the buffer offset voltage of the buffer amplifier 20 to the second output OUT2. The second control line is positively pulsed when the buffer offset voltage of the buffer amplifier 20 is to be sampled.

FIG. 3 shows a discharge transistor Q1. The discharge transistor Q1 provides a discharge path for either the signal capacitor CS or the reference capacitor CR when the a PRE_DSCH control line pulses to a high voltage potential while the signal switch transistor Q2 or the reference switch transistor Q3 are conducting. Generally, the signal capacitor CS and the reference capacitor CR are discharged before a signal voltage or a reference voltage are to be sampled and stored. Discharging the signal capacitor CS and the reference capacitor CR resets the voltage potential stored on the signal capacitor CS and the reference capacitor CR. This allows the signal voltage and reference voltage to be more accurately stored. Additionally, discharging the signal capacitor CS and the reference capacitor CR reduces the settling time of the signal voltage and the reference voltage.

A bias transistor Q10 provides bias a voltage for the output of the active pixel 2. Typically, the active pixel 2 includes a source follower circuit which functions better when the output of the active pixel 2 is biased to a fixed voltage.

The buffer amplifier 20 generates a difference voltage and an output current in which the amplitude of the difference voltage and the amplitude of the output current is proportional to the voltage potential difference between the signal voltage VS and the reference voltage VR. Prior art buffers include a gain of less than 1 (typically 0.9). The gain of the buffer amplifier 20 of the invention includes a gain of greater than 1 (typically about 1.5). The increase gain of the active pixel sensor buffer amplifier 20 of greater than 1, provides better signal integrity than the prior art buffer amplifiers which include a gain of less than 1. The gain of the active pixel sensor buffer amplifier 20 increases the signal and noise levels of the differential input voltage. The effect of noise sources which couple onto the output of the active pixel sensor buffer amplifier 20 is not as great. Therefore, the overall signal to noise ratio of the output signal is improved.

The buffer amplifier 20 includes three stages. A differential to single-ended (DTS) conversion stage 22, a buffer or source follower stage 24 and a current-mode gain stage 26.

Figure 4:
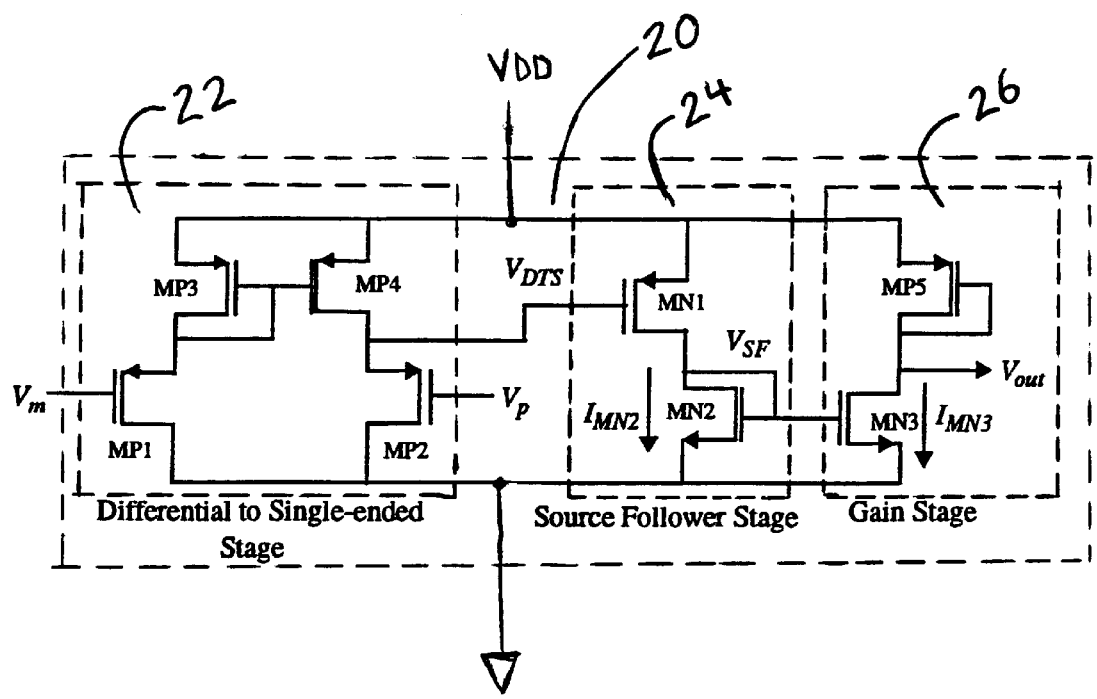
FIG. 4 show another embodiment of the invention.

FIG. 4 shows another embodiment of the invention. This embodiment includes greater detail of circuitry within the buffer amplifier 20.

The DTS conversion stage 22 receives the signal voltage VS and the reference voltage VR and generates a single DTS differential voltage. The single DTS differential voltage has an amplitude proportional to the difference between the voltage potentials of the signal voltage VS and the reference voltage VR. The DTS conversion stage 22 includes input transistors MP1, MP2, and output transistors MP3, MP4.

The buffer or source follower stage 24 generates an output current proportional to the voltage amplitude of the single DTS differential voltage. The source follower stage 24 provides buffering and voltage to current conversion. The source follower stage 24 includes an input transistor MN1 and a source follower transistor MN2. The source follower transistor MN2 is diode connected. That is, the source of the source follower transistor MN2 is electrically connected to the base of the source follower transistor MN2. The voltage to current conversion occurs because the source follower transistor MN2 is diode connected.

The current-mode gain stage 26 provides additional current gain. Additional current driving capabilities of the gain stage 26 reduce the settling time of the active pixel sensor read-out channel. The current-mode gain stage 26 includes an input transistor MN3 and an output transistor MN5. Similar to the source follower transistor MN2 of the source follower stage 24, the output transistor MN5 of the current-mode gain stage 26 is diode connected. The input transistor MN3 is an NMOS transistor. The transconductance of an NMOS transistor is typically greater than the transconductance of a PMOS transistor when the NMOS transistor and the PMOS transistor are formed by similar processes. Increasing the transconductance of the input transistor MN3 increases the current driving capabilities of the current-mode gain stage 26 which reduces the settling time of the difference voltage and the buffer offset voltage. Additionally, the structure of the gain stage 26 allows the output of the gain stage to be connected to a bus interconnection line through a gated NMOS transistor. The gated NMOS transistor can be very small. Therefore, capacitive loading of the bus interconnection bus can be minimized which reduces the settling time of the difference voltage and the buffer offset voltage.

The size of the source follower transistor MN2 of the source follower stage 24, and the size of the output transistor MN5 of the current-mode gain stage 26 can be manipulated to adjust the current drive capability of the buffer amplifier 20. Therefore, the settling time of voltage potentials on the buffer amplifier 20 output can be adjusted by adjusting the size of the source follower transistor MN2 of the source follower stage 24 and the size of the output transistor MN5 of the current-mode gain stage 26.

Typically, within an array of active pixel sensor read-out channels, the outputs of many sensor read-out channels are connected to a single bitline. The greater the number of sensor read-out channels connected to a single bit line, the greater the capacitive load connected to the bitline. As has been previously described, capacitance connected to the output of a read-out channel slows the settling time of signal voltages at the output of the read-out channel. Therefore, the settling time of each read-out channel within an array of read-out channels can be optimized by minimizing the number of read-out channels connected to each bitline within the array of read-out channels.

Figure 5:
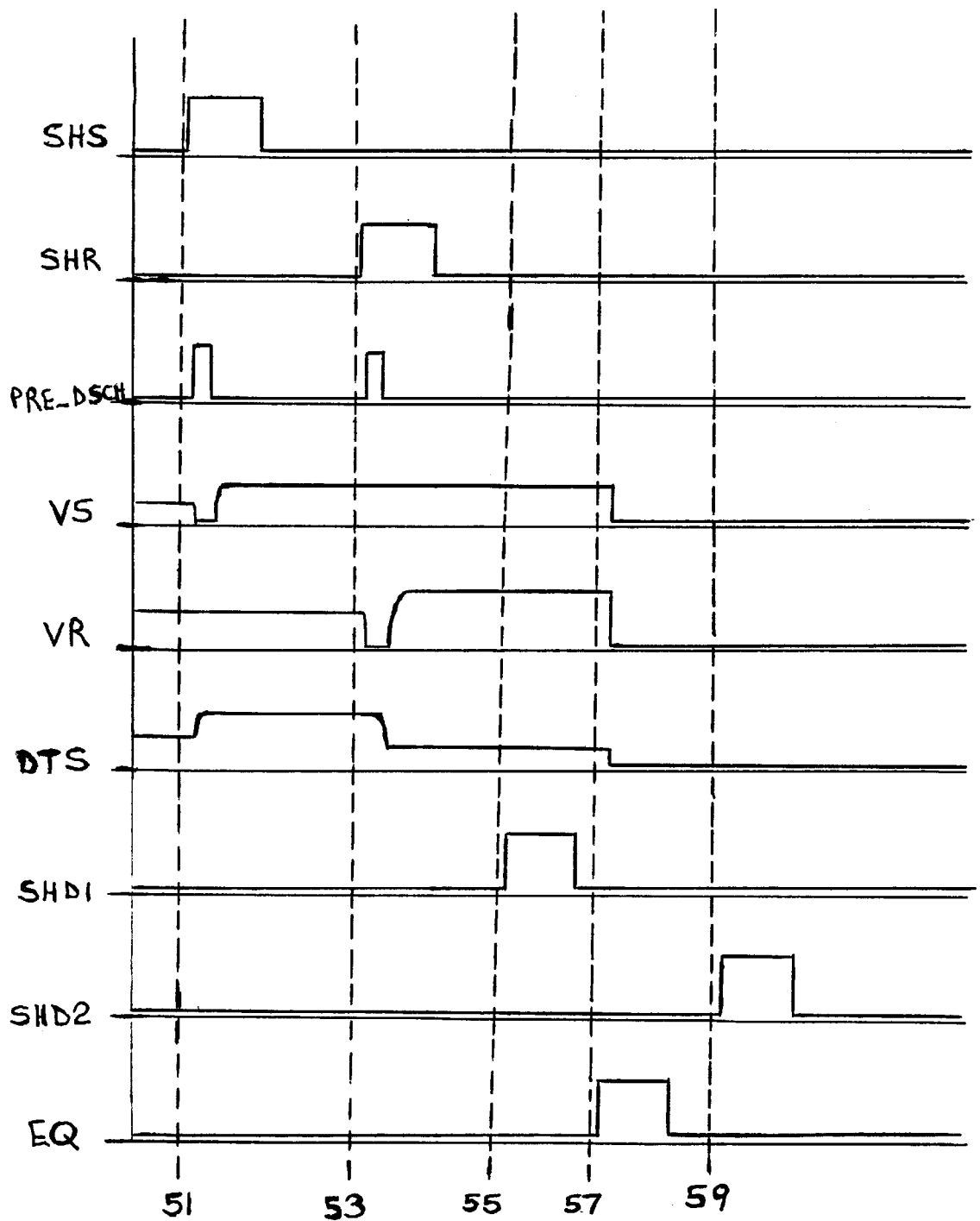
FIG. 5 is a timing diagram which depicts the control signals of the embodiments of the invention.

FIG. 5 is a timing diagram which depicts the control signals of the embodiments of the invention when sampling an image. A first event 51 includes the SHS control line pulsing on the signal switch transistor Q2. The PRE_DSCH control line pulses on the discharge transistor Q1 which discharges the signal capacitor CS. The signal switch transistor Q2 remains turned on as the signal capacitor CS charges up to the voltage potential of the signal voltage VS of the pixel cell 2.

A second event 53 includes the SHR control line pulsing on the reference switch transistor Q3. The PRE_DSCH control line pulses on the discharge transistor Q1 which discharges the signal capacitor CR. The reference switch transistor Q3 remains turned on as the reference capacitor CR charges up to the voltage potential of the reference voltage VR of the pixel cell 2.

A third event 55 includes the SHD1 control line turning on the first output transistor Q11 which allows the difference voltage of the buffer amplifier 20 to be sampled and stored. The difference voltage represents the intensity of light being received by the pixel cell 2. The buffer amplifier 20 internally subtracts the fixed pattern noise.

A fourth event 57 includes the EQ control line turning on the equalizer transistors Q4, Q5 which drives the first input and the second input of the buffer amplifier 20 to VBASE by charging the signal capacitor and the reference capacitor to the voltage potential VBASE. The output of the buffer amplifier 20 is driven to buffer offset voltage.

A fifth event 59 includes the SHD2 control line turning on the second output transistor Q13 which allows the buffer offset voltage of the buffer amplifier 20 to be sampled and stored.

The DTS trace of FIG. 5 shows the voltage potential at the output of the buffer amplifier 20 as the previously described events occur.

Although specific embodiments of the invention have been described and illustrated, the invention is not to be limited to the specific forms or arrangements of parts so described and illustrated. The invention is limited only by the claims.

What is claimed is:

1. An active pixel sensor read-out channel comprising:
   an active pixel, the active pixel driving an active pixel output to a signal voltage having an amplitude proportional to an intensity of light received by the active pixel, the active pixel driving the active pixel output to a reference voltage when the active pixel is not receiving light;
   a sample and hold circuit for receiving the active pixel output, the sample and hold circuit sampling and storing the signal voltage and sampling and storing the reference voltage; and
   a buffer amplifier generating a single output difference voltage between the sampled and stored signal voltage and the sampled and stored reference voltage, and generating an output current having an amplitude which is presetably greater than an amplitude of a buffer current of a buffer stage of the buffer amplifier.

2. The active pixel sensor read-out channel as recited in claim 1, wherein the buffer amplifier comprises:
   a differential to single end amplifier stage receiving the sampled and stored signal voltage and the sampled and stored reference voltage and generating a single output voltage which has a voltage potential proportional to the difference between the sampled and stored signal voltage and the sampled and stored reference voltage;
   the buffer stage receiving the single output voltage and generating the buffer current having an amplitude which is proportional to the voltage potential of the single output voltage; and
   a gain stage which receives the buffer current and generates the single output difference voltage and the output current having an amplitude which is presetably greater than the amplitude of the buffer current.

3. The active pixel sensor read-out channel as recited in claim 2, wherein the buffer stage comprises a source follower.

4. The active pixel sensor read-out channel as recited in claim 2, wherein the gain stage comprises a gain stage output that is connected to a multiplexed bitline within an array of bitlines.

5. The active pixel sensor read-out channel as recited in claim 1, wherein the sample and hold circuit comprises:
   a signal storage element;
   a signal voltage switch for connecting the active pixel output to the signal storage element to allow the signal storage element to store the signal voltage;
   a reference storage element; and
   a reference voltage switch for connecting the active pixel output to the reference storage element to allow the reference storage element to store the reference voltage.

6. The active pixel sensor read-out channel as recited in claim 5, wherein the sample and hold circuit further comprises means for setting a voltage stored by the signal storage element to be equal to a voltage stored by the reference storage element.

7. The active pixel sensor read-out channel as recited in claim 5, further comprising means for discharging the signal storage element and the reference storage element.

8. The active pixel sensor read-out channel as recited in claim 5, wherein the signal storage element is a signal capacitor and the reference storage element is a reference capacitor.

9. The active pixel sensor read-out channel as recited in claim 1, wherein the active pixel sensor read-out channel further comprises means for equalizing inputs to the buffer amplifier to allow offset errors within the buffer amplifier to be determined.

10. The active pixel sensor read-out channel as recited in claim 1, wherein the buffer amplifier has a gain of greater than one.

* * * * *